(12) United States Patent
Zarrinkhat et al.

(10) Patent No.: US 7,246,297 B2
(45) Date of Patent: Jul. 17, 2007

(54) TIME-INVARIANT HYBRID ITERATIVE DECODERS

(76) Inventors: Pirouz Zarrinkhat, 1801-1375 Prince of Wales Drive, Ottawa, Ontario (CA) K2C 3L5; Sayed Amirhossein Banihashemi, 3843 Marble Canyon, Gloucester (CA) K1V 1P8

(*) Notice: Subject to any disclaimer, the term of this patent is extended or adjusted under 35 U.S.C. 154(b) by 525 days.

(21) Appl. No.: 10/845,262

(22) Filed: May 14, 2004

(65) Prior Publication Data

US 2005/0257116 A1    Nov. 17, 2005

(51) Int. Cl.
*H03M 13/00* (2006.01)

(52) U.S. Cl. .................. 714/755; 714/797; 714/786; 714/794; 375/341; 375/262

(58) Field of Classification Search ............... 714/755, 714/797, 786, 792, 794–796; 375/262, 265, 375/26, 341, 279
See application file for complete search history.

(56) References Cited

U.S. PATENT DOCUMENTS

2005/0229090 A1* 10/2005 Shen et al. ................ 714/801

OTHER PUBLICATIONS

Ardakani et al., "Gear-shift decoding", *Proc. 21sf Bienn 1 Symp. Commun.*, (Jun. 2002), Kingston, ON, Canada, pp. 86-90.
Banihashemi et al. "Hybrid (Multistage) Decoding Of Low-Density Parity-Check", (*LDPC*) *codes. Proc. 40h Ann 1 Allerton Conf Commun., & Computing*, Oct. 2002, Allerton, IL, USA, pp. 1437-1438.
Bazzi (L.) et al., "Exact Thresholds And Optimal Codes For The Binary Symmetric Channel And Gallager's Decoding Algorithm A", *Proc. Int'l Symp. Inform. Theory*, Jun. 2000, Sorrento, Italy, p. 203.
Bazzi L. et al. "Exact Thresholds And Optimal Codes For The Binary Symmetric Channel And Gallager's Decoding Alogrithm A", *IEEE Trans. Inform. Theory*, accepted for publication, pp. 1-21.
Berrou et al., "Near Shannon Limit Error -Correcting Coding And Decoding: Turbo-Codes (I)", *Rec. IEEE Int'l Conf Commun.—ICC*, May 1993, Geneva, Switzerland, pp. 1064-1070.
Burshtein et al., "Bounds On The Performance Of Belief Propagation Decoding", *IEEE Transactions of Information Theory*, Jan. 2002, 48, No. 1, pp. 112-122.
Chung, "On The Construction Of Some Capacity-Approaching Coding Schemes", *MIT, MA*, USA Sep. 2000.
Forney, Jr., "On Iterative Decoding And The Two-Way Algorithm", *Proc. JSt Int'l Symp. Turbo Codes & Related Topics*, Sep. 1997, Brest, France, pp. 12-25.

(Continued)

*Primary Examiner*—Guy J. Lamarre
(74) *Attorney, Agent, or Firm*—Jeffrey M. Measures; Borden Ladner Gervais LLP

(57) ABSTRACT

An iterative decoder for receiving a sequence of samples representing a series of symbols, and for decoding the received sequence to the series. The decoder includes a plurality of variable-nodes. Each node receives and stores a sample from the sequence, iteratively passes messages to, and receives messages from, at least two connected check-nodes in a plurality of check-nodes, sends each connected check-node a message determined in accordance with the stored sample and message received from the at least one other check-node segment, and provides as output a decoded symbol determined in accordance with the received messages from the connected check-nodes and the stored sample.

20 Claims, 10 Drawing Sheets

OTHER PUBLICATIONS

Gallager, "Low-Density Parity-Check Codes", *Cambridge, MA: MIT Press*, 1963, pp. 1-90.

Khandekar et al., "A Lower Bound On The Iterative Decoding Threshold Of Irregular LDPC Code Ensembles", *Proc. 36th Ann 'l Conf Information Sci. & Sys.*, Mar. 2002, Princeton U., Princeton, NJ, USA.

Luby, et al., "Efficient Erasure Correcting Codes", *IEEE Transactions of Information Theory*, Feb. 2001, 47, No. 2, pp. 569-584.

Luby et al., "Improved Low-Density Partiy-Check Codes Using Irregular Graphs", *IEEE Transactions of Information Theory*, Feb. 201, 47, No. 2, pp. 585-598.

Miladinovic et al., "Improved Bit Flipping Decoding Of Low-Density Parity Check Codes", *Proc. Int'l Symp. Information Theory*, Jun.-Jul. 2002, Lausanne, Switzerland, p. 229.

Richardson et al., "Design Of Capacity-Approaching Irregular Low-Density Parity-Check Codes", *IEEE Transactions of Information Theory*, Feb. 2001, 47, No. 2, pp. 619-637.

Richardson et al., "The Capacity Of Low-Density Parity-Check Codes Under Message-Passing Decoding", *IEEE Transactions of Information Theory*, Feb. 2001, vol. 47, No. 2, pp. 599-618.

Sipser et al., "Expander Codes", *Proc. 35th IEEE Symp. Found. Comp. Sci.*, Nov. 1994, Santa Fe, NM, USA, pp. 566-576.

Tanner, "A Recursive Approach To Low Complexity Codes", *IEEE Transactions of Information Theory*, Sep. 1981, 27, No. 5, pp. 533-547.

ten Brink, "Convergence Behavior Of Iteratively Decoded Parallel Concatenated Codes" ,*IEEE Transactions on Communications*, Oct. 2001, 49, pp. 1727-1737.

Wiberg et al., "Codes and iterative decoding on general graphs". *Euro. Trans. Telecomm.*, Sep.-Oct. 1995-6, No. 5, pp. 513-526.

Wiberg, "Codes And Decoding On General Graphs", *Linkoping Univ., Linkoping, Sweden*, Oct. 1996.

Zarkeshvari et al., "On implementation of Min-Sum algorithm for decoding low-density parity-check (LDPC) codes", *Proc. IEEE Global Telecommun. Conf—GLOBECOM*, Nov. 2002, Taipei, Taiwan, pp. 1349-1353.

Zarrinkhat et al., "Density-Evolution And Convergence Properties Of Majority-Based Algorthims For Decoding Low-Density Parity-Check (LDPC) Codes", *Proc. 40th Ann 'l Allerton Conf Commun., Cont., & Computing*, Oct. 2002, Allerton, IL, USA, pp. 1425-1434.

Zarrinkhat et al., "Density Evolution And Convergence Properties Of Hybrid Iterative Algorithms For Decoding Low-Density Parity-Check Codes", *Proc. 8th Can. Work. Inform. Theory*, May 2003, Waterloo, ON, Canada, pp. 40-43.

Zarrinkhat et all, "Hybrid Decoding of Low-Density Parity-Check Codes", *Proc. 3$^{rd}$ International Symposium Turbo Codes & Related Topics*, Sep. 2003, pp. 503-506.

Zarrinkhat et al., "Hybrid Decoding of Low-Density Parity-Check Codes", *IEEE Coinmun. Lett.*, Apr. 2004, 8, pp. 250-252.

Zarrinkhat, et al., "Hybrid Hard-Decision Iterative Decoding Of Regular Low-Density Parity-Check Codes", *Rec. IEEE Int'l Conf Commun.—ICC*, Jun. 2004, Paris, France, pp. 435-439.

Zarrinkhat et al., "Time-invariant and switch-type hybrid iterative decoding of low-density parity-check codes", *Ann. Thl#commun. /Ann. Telecoinmun.*, accepted for publication.

Zarrinkhat et al., "Threshold values and convergence properties of majority-based algorithms for decoding regular low-density parity-check codes", *IEEE Trans. Commun.*, accepted for publication.

\* cited by examiner

TIME-INVARIANT HYBRID ITERATIVE DECODERS

FIELD OF THE INVENTION

The present invention relates generally to methods and systems for iteratively decoding coded received signals. More particularly, the present invention relates to methods and systems for hybrid iterative decoding of received coded signals.

BACKGROUND OF THE INVENTION

In the field of telecommunications, there is great interest in iterative decoding algorithms. Some error correcting codes, such as turbo-codes and low-density parity-check (LDPC) codes require iterative decoding to properly determine the encoded message after transmission through a noisy channel. Attention is directed to iterative decoding methods due to their contribution to the overall coded channel performance.

After their introduction by Gallager in the 1960's, LDPC codes were considered to be too computationally complex to be easily implemented. However, as computational power of telecommunications equipment advanced, and in concert with the interest paid to turbo-codes, LDPC codes have been an area of great focus and development.

The iterative decoding of turbo and LDPC codes is an area of particular interest in the field. Improvements in decoding techniques have allowed greater utilization of telecommunication channels.

For the sake of clarity, the following discussion will focus on the iterative decoding of LDPC codes, through one skilled in the art will appreciate that similar approaches are employed in other iterative decoding approaches.

A graphical representation of an iterative decoder 100 known in the art is provided in FIG. 1. A plurality of variable-nodes, labelled $v_1$ 102, $v_2$ 104, $v_3$ 106, $v_4$ 108, $v_5$ 110, and $v_6$ 112, receive a sequence of samples representing a series of symbols, forming a code word, transmitted by an encoder. Due to the presence of noise in the transmission channel, the sequence of samples cannot be simply mapped to a series of symbols using a look up table. However, with sufficient use of error-correction coding, a received sequence of samples can be decoded to a candidate codeword with a desired amount of certainty. Each variable-node is connected to at least one of the check-nodes labelled $c_1$ 114, $c_2$ 116, $c_3$ 118 and $c_4$ 120. Each connection between a variable-node and a check-node is referred to as an edge. Along these edges, messages are passed between the nodes. Each node, either check or variable, applies a predefined function to the received message prior to passing the result back.

The functions performed by the variable and check-nodes correspond to a desired decoding algorithm such as majority-based (MB) algorithms, minimum sum (min-sum) algorithms and belief propagation algorithms. MB algorithms can be implemented with minimal computational complexity, and a small implementation area, as they rely upon hard decisions. Min-sum and belief propagation algorithms provide faster convergence than MB algorithms, which can be used to reduce the number of iterations required to obtain the desired certainty in decoding, however, both these algorithm types rely upon soft decisions, and are thus more computationally complex, and require a greater implementation area for the increased logic required. The more computationally complex algorithms also allow reliable communication to be achieved over channels with worse characteristics than the worst channel that MB algorithms can reliably work over.

In conventional iterative decoding systems, such as the one illustrated in FIG. 1, decoder 100 will iteratively decode the received sequence of samples using a selected algorithm by repeatedly passing extrinsic messages between the variable and check-nodes. The algorithm used by the nodes is selected based on an acceptable trade-off in the number of iterations required, the time required by each iteration, and the implementation complexity. The implemented algorithm is preferably selected and implemented with knowledge about the characteristics of the transmission channel and the encoding method. The arrangement of the edges is specifically related to the encoding methodology, and allows for the decoding of encoded messages. The selection of the decoding algorithm based on knowledge of the transmission channel allows algorithms to be refined to improve their decoding performance based on specific channel properties such as noise distribution.

Although soft decision algorithms provide improved performance, they impose implementation complexity penalties related to the time required to execute each iteration and to the required implementation area. Decoders implemented solely in software are concerned largely with the first of the penalties, while dedicated hardware decoders are more concerned with the second of the penalties. In a hardware decoder, the increased logic required to implemented soft decoding algorithms also imposes a power consumption penalty, which often serves as an incentive to use hard decision algorithms such as MB algorithms despite the longer convergence time.

In the 1960's Gallager offered a hybridized decoder architecture that offers some of the performance advantages of soft decision decoding while reducing the computational complexity required by conventional soft decision decoders. The decoder taught by Gallager is a type of a hybrid switch type ($H_{ST}$) decoder. If a decoding operation can be represented by a function $\Delta$, the hybrid switch type decoding operation is represented by a function $\Delta(l)$, where $l$ represents the iteration number. The simplest of the hybrid switch type decoders is represented by the function $$\Delta(l) = \begin{cases} \Delta_A, & 0 \le l \le x \\ \Delta_B, & x < l \end{cases}.$$

Graphically represented, the decoder is identical to the decoder illustrated in FIG. 1 for $0 \le l \le x$. However, after the $x^{th}$ iteration, a new set of operators are performed by the check and variable-nodes to perform the decoding operation. This allows a switch between decoding algorithms. After the $x^{th}$ iteration, the hybrid switch type decoder is represented by decoder 122 of FIG. 2. Variable-node $v_{1B}$ 124, $v_{2B}$ 126, $v_{3B}$ 128, $v_{4B}$ 130, 132 and $v_{6B}$ 134 connect to the check-nodes $c_{1B}$ 136, $c_{2B}$ 138, $c_{3B}$ 140 and $c_{4B}$ 142, same configuration as the decoder of FIG. 1, however, both the check and the variable-nodes perform different operations that correspond to the new decoding function $\Delta_B$. Along with the new operators, the style of message passed along the edges can also change at the switch point.

The $H_{ST}$ architecture decoders allow for a fixed number of iterations to be performed using a more complex decoding algorithm, while allowing the bulk of the iterations to be performed with simple to implement decoding algorithms such as MB algorithms. Even a few iterations using a more robust operation, such as min-sum, greatly reduces the performance gap between the robust and the computationally simple implementations, while also reducing the overall computational intensity of the decoding operation. It has also been found the even if only MB algorithms are used, $H_{ST}$ implementations provide performance improvements over the constituent codes. One great detriment to the implementation of hardware based $H_{ST}$ decoders is the increased implementation area required. Because the variable and check-nodes for each iteration grouping perform different operations, different sets of variable and check-nodes must be provided, as does message routing circuitry for managing the switchover between operations. FIG. 3 illustrates an exemplary logical implementation of an $H_{ST}$ decoder for $$\Delta(l) = \begin{cases} \Delta_A, 0 \le l \le x \\ \Delta_B, x < l \end{cases}.$$

As illustrated in FIG. 3, the implementation of an $H_{ST}$ decoder 144 requires the connection of decoder 100 to decoder 122. The overall structure includes the variable and check-nodes corresponding to function $\Delta_A$, $v_{1A}$ 102, $v_{2A}$ 104, $v_{3A}$ 106, $v_{4A}$ 108, $v_{5A}$ 110, $v_{6A}$ 112, $c_{1A}$ 114, $c_{2A}$ 116, $c_{3A}$ 118 and $c_{4A}$ 120 arranged as they are in FIG. 1. However, the check-nodes, $c_{1A}$ 114, $c_{2A}$ 116, $c_{3A}$ 118 and $c_{4A}$ 120, have an external control so that after a predetermined number of iterations, in this example after the $x^{th}$ iteration, the check-nodes pass the message to the variable-nodes corresponding to the second decoding function $\Delta_B$, $v_{1B}$ 124, $v_{2B}$ 126, $v_{3B}$ 128, $v_{4B}$ 130, $v_{5B}$ 132 and $v_{6B}$ 134. The second set of variable-nodes iteratively pass messages to the second set of check-nodes $c_{1B}$ 136, $c_{2B}$ 138, $c_{3B}$ 140 and $c_{4B}$ 142, with the same edge configuration. The connection of the first set of check-nodes to the second set of variable-nodes uses the same edge mapping as the first stage. One skilled in the art will appreciate that if the function performed by the first and second set of check-nodes is the same, the second set of check-nodes could be omitted, and the messages would be passed along the edges between the check-node and each of the two sets of variable-nodes as determined by the routing control. In another embodiment, if the variable-nodes perform the same operation, but the check-nodes perform a different operation after the switch, the variable-nodes can be reused.

The implementation of FIG. 3 illustrates one of the great disadvantages of the hardware implementation of an $H_{ST}$ decoder. Because the variable-nodes and check-nodes perform different operations, each function used in an $H_{ST}$ decoder must have its own set of variable-nodes. Thus, the performance benefit of the $H_{ST}$ decoder is offset by an implementation complexity penalty. Re-use of circuitry between the two different sets of variable-nodes is difficult as the logic used for different operators does not typically provide a great deal of overlap. Furthermore, soft decision operators heavily rely upon a characterization of the transmission channel, and repeated iterations using soft decision operators relying upon an erroneous characterization are known to decrease the performance of a decoder.

Codes can be classified as either regular or irregular based on their graphical representations. In a regular code, each variable-node connects to the same number of check-nodes as every other variable-node, and similarly every check-node connects to the same number of variable-nodes as every other check-node. Thus a code described as a regular ($d_v$, $d_c$) code has every variable-node connected to $d_v$ check-nodes, and every check-node connected to $d_c$ variable-nodes. In such a code, the variable-nodes are referred to as being of degree $d_v$ as they each have $d_v$ edges. In an irregular code, nodes can be grouped by their degree, so that one grouping of variable-nodes are of degree $d_{v1}$, while another grouping are of degree $d_{v2}$. Thus the variable-nodes in the first grouping connect to $d_{v1}$ check-nodes, while the variable-nodes in the second grouping connect to $d_{v2}$ check-nodes. Check-nodes can be similarly partitioned.

In an irregular $H_{ST}$ decoder, each node in a degree grouping switches to the next constituent algorithm with the other nodes in its group, but not necessarily with the all other nodes of its type. As a result, an $H_{ST}$ decoder having 20% of its variable-nodes of degree $d_{v1}$, and 80% of its variable-nodes of degree $d_{v2}$, switching between MB algorithms can have all variable-nodes start with $MB^0$, after the $10^{th}$ iteration have all variable-nodes of degree $d_{v1}$ switch to $MB^1$, after the $15^{th}$ iteration have all variable-nodes of degree $d_{v2}$ switch to $MB^2$, and after the $20^{th}$ iteration have all variable-nodes of degree $d_{v1}$ also switch to $MB_2$. Irregular $H_{ST}$ decoders provide performance improvements over regular $H_{ST}$ decoders with proper selection of the degree groupings, the constituent algorithms assigned to the groupings and the iteration at which algorithms are switched. In each of the MB algorithms, the check-nodes perform the same operation, so switching between consistent algorithms in the check-nodes is not necessary. The irregularity described above relates to an irregular edge structure.

From the above discussion it is apparent to one skilled in the art, that standard iterative decoders either lack sufficient performance and require too many iterations to converge, or rely upon complex circuitry and channel characterizations that must be accurate, while $H_{ST}$ decoders are difficult to implement in hardware, and regardless of how they are implemented are heavily reliant upon the correct characterization of the transmission channel to obtain desired performance. Though channel characterization is possible, it is often found that the laboratory characterization of channel does not identically correspond to real world situations, where installation of a physical channel can introduce irregularities in the channel properties, as does the aging of an installed channel. Non-installed channels, such as wireless communications links, are also subject to unplanned changes in their characteristics over finite time intervals, which adversely affect the performance of functions dependent upon accurate channel characterization.

It is, therefore, desirable to provide an iterative decoder architecture that simplifies implementation in hardware, and offers a reasonable degree of immunity to variation in the characterization of a channel.

SUMMARY OF THE INVENTION

It is an object of the present invention to obviate or mitigate at least one disadvantage of previous iterative decoders.

In a first aspect of the present invention, there is provided an iterative decoder for receiving a sequence of sample representing a series of symbols, and for decoding the received sequence to the series. The decoder comprises a plurality of variable-nodes. Each node for receiving and storing a sample from the sequence, for iteratively passing messages to, and receiving messages from, at least two connected check-nodes in a plurality of check-nodes, for sending each connected check-node a message determined in accordance with the stored sample and message received from the at least one other check-node segment, and for providing as output a decoded symbol determined in accordance with the received messages from the connected check-nodes and the stored sample. At least one node selected from the plurality of variable-nodes and the plurality of check-nodes forms a partition in the respective plurality, the at least one node being of the same degree as at least one node in the at least one other partition, the nodes in each partition using an operation unique to the partition to determine the message to pass to connected nodes.

In an embodiment of the first aspect of the present invention, the number of nodes in each partition is determined using a probability mass function. In another embodiment, the operations performed by each node correspond to either a hard decision based decoding operation, such as a majority based decoding operation, or a soft decision based decoding operation such as max-log, max-log-APP, belief propagation, and min-sum decoding operations. In another embodiment, each variable-node is connected to at least 2 check-nodes.

In another aspect of the present invention, there is provided an iterative decoder for decoding a sequence of samples to a series of symbols. The decoder has a plurality of nodes. The plurality has a check-node segment and a variable-node segment. Each segment has at least two nodes. Each node in the plurality has a degree, preferably defined by the number of nodes connected to it. Each node is connected to at least two other nodes in the other segment for receiving a message from the connected nodes. Each of the nodes in the variable-node segment is for receiving and storing a sample from the sequence of samples, for sending each connected node in the check-node segment a message determined in accordance with the stored sample and messages received from the at least one other node in the check-node segment, and for providing as output a decoded symbol determined in accordance with the received messages from connected nodes in the check-node segment and the stored sample. Each of the nodes in the check-node segment is connected to at least two nodes in the variable-node segment, and is for receiving and transmitting messages to each connected node in the variable-node segment, the transmitted messages determined in accordance with the result of an operation performed on messages received from the at least one other connected node. At least one of the nodes in the plurality determines messages in accordance with a different operation than at least one other node having the same degree in the same segment.

In a further aspect of the present invention, there is provided a method of decoding a sequence of samples to a series of symbols in an iterative decoder having a plurality of variable-nodes and plurality of check-nodes, each of the nodes in each plurality connected to at least two nodes in the other plurality, the number of connections to any node in the plurality defining the degree of the node. The method comprises receiving and storing one of the samples in the sequence at each of the variable-nodes in the plurality; passing a message from each variable-node in the plurality of variable-nodes, to the connected nodes in the plurality of check-nodes, the message determined in accordance with an operation performed on the stored sample; passing a message from each check-node to the connected nodes in the plurality of variable-nodes, the message for each connected node determined in accordance an operation performed on the at least one other message received at the check-node; at each of the variable-nodes in the plurality, receiving at least two messages from connected nodes, and passing a message to each connected node, the message for each connected node determined in accordance with the message received from the at least one other connected node and the stored sample; repeating both the steps of passing a message and the step of receiving and passing, for a predetermined number of iterations, in at least one of the iterations, at least one of the nodes selected from either of the pluralities for passing a message determined in accordance with an operation distinct from the operation performed by at least one other node of the same degree in its plurality; and providing as an output, from each variable-node in the plurality of variable-nodes a decoded symbol determined in accordance with the messages received from the connected nodes in the final iteration and the stored sample.

In an embodiment of the present invention, each sample is one bit in length. In another embodiment, the operation performed by each variable-node is selected from a list including soft decision and hard decision decoding operations such as a majority based operation. In another embodiment, the operation performed by each check-node is selected from a list including soft decision and hard decision decoding operations, where preferably the operation is a majority based operation. In another embodiment, the number of iterations is predetermined to provide an acceptable error rate, and optionally wherein in all iterations, at least one node passes a message determined in accordance with an operation distinct from the operation performed by at least one other node of the same degree in its plurality. In a further embodiment, the number of nodes passing a message determined in accordance with an operation distinct from the operation performed by at least one other node of the same degree in its plurality, is determined by a probability mass function. In another embodiment, the operation used by each node to determine messages is time invariant. In a further embodiment, the particular nodes passing a message determined in accordance with an operation distinct from the operation performed by at lest one other node of the same degree in its plurality are determined randomly. In a further embodiment at least one check-node and at least one variable-node pass messages determined using operations distinct from the operations performed by at least one other node of the same degree in their respective pluralities.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention relates to a novel iterative decoder architecture. Though the discussion presented below is directed to the iterative decoding of LDPC codes, this is solely to provide a compact discussion. The novel method and system of the present invention can be applied to other code types requiring iterative decoding, including turbo-codes.

Figure 1:
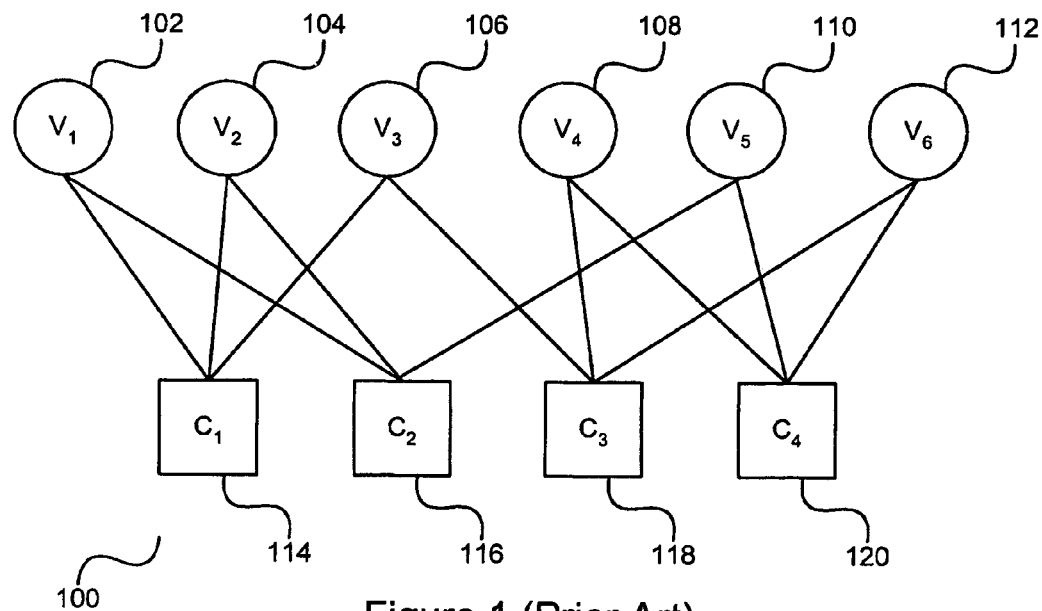
FIG. 1 is an illustration of a logical representation of a prior art iterative decoder.
Figure 2:
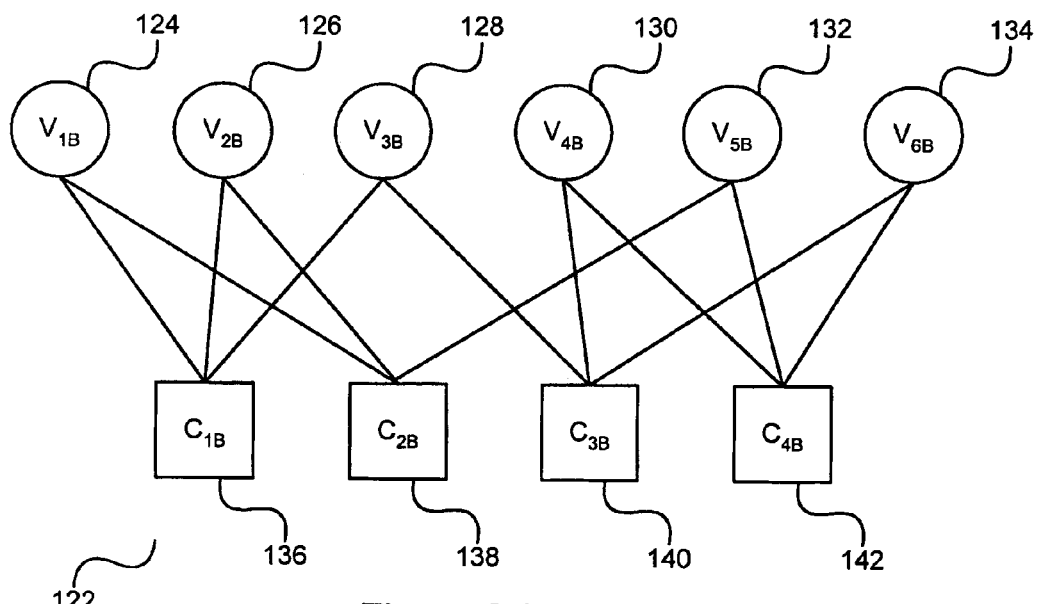
FIG. 2 is an illustration of a logical representation of the second stage of a prior art hybrid switch type iterative decoder.
Figure 3:
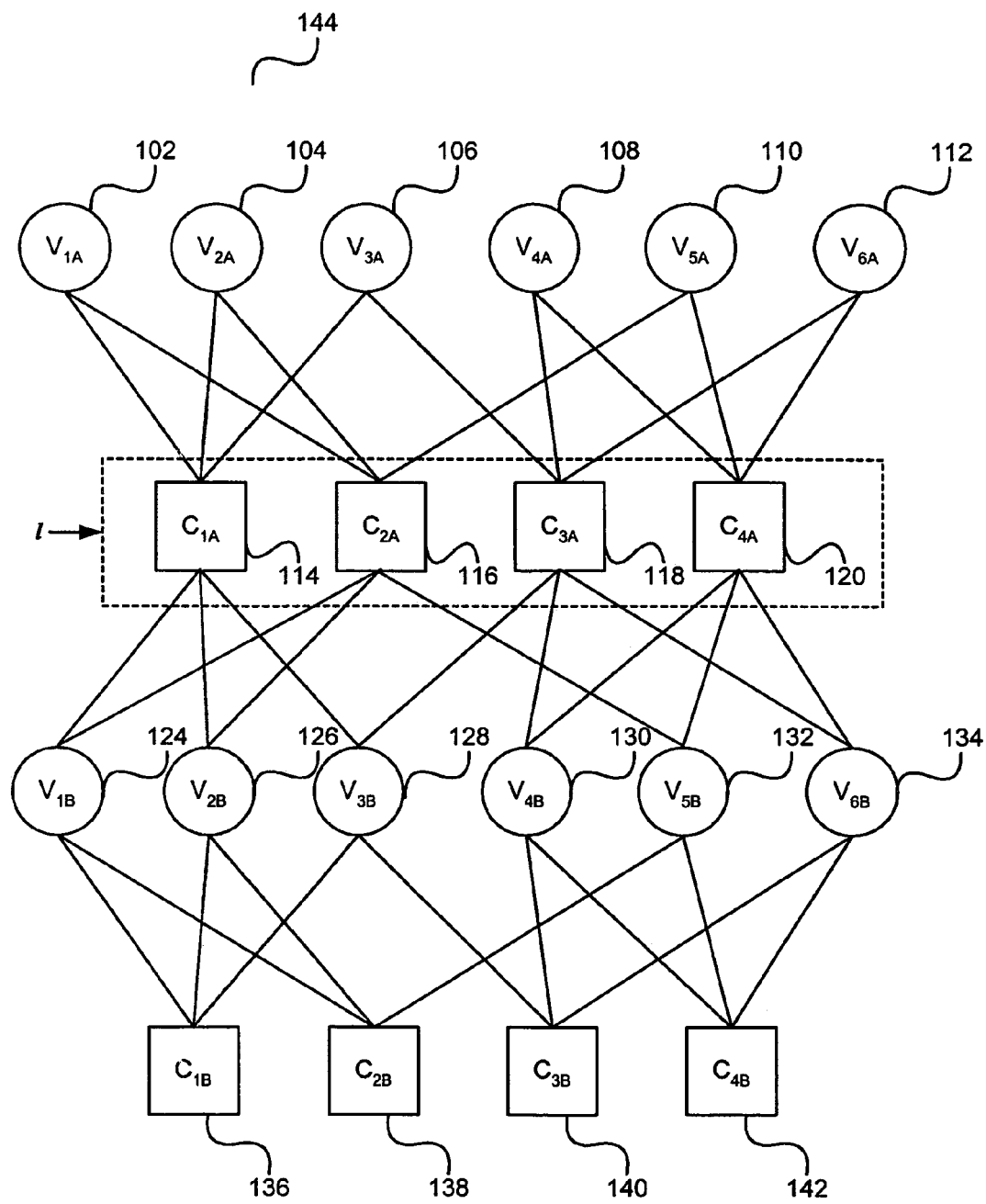
FIG. 3 is an illustration of a logical representation of a two stage hybrid switch type decoder.
Figure 4:
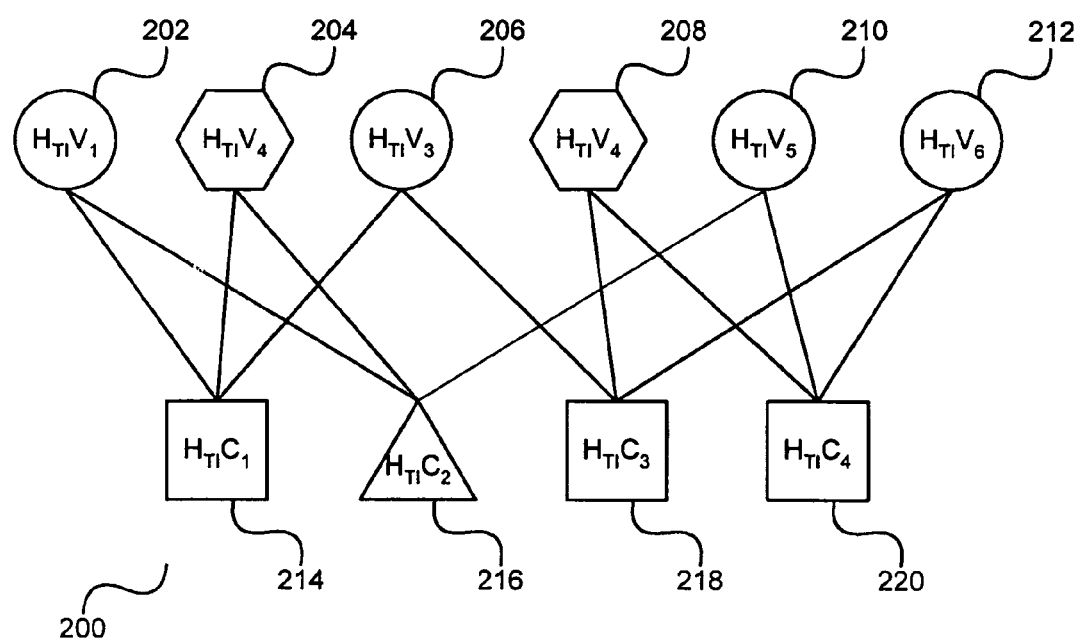
FIG. 4 is an illustration of the logical representation of a system of the present invention.

FIG. 4 illustrates the logical graph representation of a decoder 200 of the present invention. Where prior art systems use one decoding algorithm per decoder, or per decoder iteration, for each node degree, the present invention utilizes multiple decoding algorithms. Nodes having different decoding operations, and thus nodes that perform different decoding operations, are represented by different node symbols in FIG. 4 for the sake of clarity.

Because the structure of the decoder utilizes multiple algorithms it can be classified as a hybrid decoder. In distinction to the $H_{ST}$ decoder taught in the prior art, the present invention can be implemented in a time invariant manner, so that the distribution of the multiple algorithms does not vary between iterations. As a result the present invention is herein referred to as a hybrid time-invariant ($H_{TI}$) decoders. In another embodiment, the distribution of the decoding algorithms is fixed, but the operation performed by a node can vary between iterations. Where irregularly structured decoders in the prior art provide performance advantages over regularly structured decoders, the present invention takes advantage of an irregularity in the decoding operation which can be implemented with either regularly or irregularly structured decoders.

FIG. 4 illustrates the logical architecture of $H_{TI}$ decoder 200. Decoder 200 has a plurality of nodes segmented into variable-nodes, which are also referred to as bit nodes, $H_{TI}v_2$204, $H_{TI}v_3$206, $H_{TI}v_4$208, $H_{TI}v_5$210 and $H_{TI}v_6$ 212 and check-node $H_{TI}C_1$ 214, $H_{TI}c_2$ 216, $H_{TI}c_3$ 218 and $H_{TI}c_4$ 220. The variable-nodes are partitioned according to the operation that they each perform. $H_{TI}V_1$ 202, $H_{TI}v_3$ 206 and $H_{TI}v_5$210 form a partition, while $H_{TI}V_2$ 204 and $H_{TI}v_6$ 212 form another. The check-nodes are similarly partitioned, with $H_{TI}C_1$ 214, $H_{TI}c_3$ 218 and $H_{TI}c_4$ 220 forming one partition, while $H_{TI}c_2$ 216 forms the other.

Each node performs an operation defined by a decoding algorithm that it shares with the other nodes in the same partition. Each partition has its own defined algorithm. The nodes in each partition need not be limited to nodes of the same degree. While an irregular decoder may have all nodes of a first degree performing one decoding operation, while all nodes of a second degree perform another, the decoder of the present invention, does not require that the partitions be made using degree as a distinction. Thus, the present invention utilizes a node performing a decoding operation different than the operation performed by at least one other node of the same degree. Thus, $H_{TI}$ decoders can be either regular or irregular in structure and still perform a plurality of decoding operations in at least one decoding iteration.

FIG. 4 should be viewed as exemplary and not as restrictive. Any number of nodes can form a partition, and the number of partitions in the check and variable segments need not be the same. Thus, the present invention can be reduced to an almost standard decoder where one node performs a different operation than at least one other node of the same type and having the same degree in at least one iteration.

In operation, decoder 200 receives a sequence of sample corresponding to a series of symbols transmitted over a channel. The sequence of samples cannot be simply mapped to a series of symbols because noise during transmission may have corrupted the transmission. However, the error-correcting code used in the encoding process allows for the decoding operation to correct a predetermined number of incorrect symbols. As in a standard decoder, each variable-node receives a sample representing a channel message. As a function of the received channel message, a message is determined and is passed to each connected check-node along the defined edges. Each check-node then determines a message to pass back along the edges based on the other messages received. Thus, if a check-node has three edges, it determines three different messages to pass back, each message a function of the received messages. To complete the iteration, each variable-node receives one message per edge. In the next iteration, a new extrinsic message, for each edge, is determined in accordance with the channel message, and the message received from the other edges. This process repeats until the required number of iterations is completed. In the present invention, each variable-node receives a sample, and performs an operation defined by an algorithm shared by other nodes in the same partition. For the sake of simplicity, the following discussion will focus only upon standard MB algorithms to allow for a simpler performance analysis. One skilled in the art will appreciate that other algorithms can be used without departing from the scope of the present invention. Thus, $H_{TI}v_1$ 202, $H_{TI}v_3$ 206 and $H_{TI}v_5$210 perform one standard decoding operation, such as $MB^0$, while $H_{TI}v_2$204 and $H_{TI}v_6$212 perform another, such as $MB^1$. Each operation is performed at a variable-node, and a message is passed from the variable-nodes to the check-nodes that they are connected to by edges. $H_{TI}c_1$ 214, $H_{TI}c_3$ 218 and $H_{TI}c_4$ 220 then perform one check-node operation, while $H_{TI}c_2$ 216 performs forms another. Upon completion of the check-node operation, a message is passed back to the variable-nodes, where a further operation is performed using the received message. This process continues for a predefined number of iterations, until the process terminates, and the variable-nodes contain the decoded sequence. The selection of nodes for each partition can be done randomly using a probability mass function as is described below.

A more technical view of the present invention will now be presented.

An LDPC code, like any other linear block code, can be fully described by its parity-check matrix. A "1" located at position (i, j) of the code's parity-check matrix indicates that the $j^{th}$ bit of any codeword participates in the $i^{th}$ parity-check equation. However, as the adjective low-density suggests, the parity-check matrix of a typical LDPC code is sparse. This property results in iterative decoding algorithms having feasible complexity even at large block lengths. The structure of an LDPC code is well portrayed using bipartite graphs, such as the one provided in FIG. 4, constructed based on the code's parity-check-matrix. The two sets of nodes in such graphs, the variable-nodes and the check-nodes, correspond to the columns and the rows of the parity-check matrices, respectively. In the graphical representation of a code, an edge connects variable-node $v_j$ and check-node $c_i$ if and only if a "1" is located at position (i, j) of the parity-check matrix.

In a regular LDPC code, column and row weights of the parity-check matrix are fixed. In particular, a $(d_v, d_c)$-regular LDPC code is a code described by a parity-check matrix in which the column weight is $d_v$ (meaning that each bit participates in $d_v$ parity-check equations) and the row weight is $d_c$ (meaning that each parity-check equation checks the parity among $d_c$ bits). If all the rows are linearly independent, the rate of such a code is $1-d_v/d_c$. In a graphical representation, each variable-node connects to $d_v$ check-nodes, and each check-node connects to $d_c$ variable-nodes. Codes that do not follow this pattern are regarded as irregular codes. As described above, in an irregular LDPC code, column and row weights of the parity-check matrix are chosen according to some degree distributions. By carefully choosing the distributions, code's error performance can be considerably improved. The decoding process is performed by iteratively exchanging messages between variable-nodes and check-nodes along the edges of the graph representing the code in both directions. An iterative decoding algorithm is said to be based on message-passing if only extrinsic messages are exchanged. A message-passing decoding algorithm is specified by its variable-node and check-node message mappings, which represent the processing performed at the variable-nodes and the check-nodes, respectively.

Hybrid decoding algorithms belong to the family of message-passing decoding algorithms, and are devised by combining existing algorithms. Hybrid algorithms are capable of improving error performance and convergence speed at the expense of a small increase in the complexity of the decoder's structure.

Consider $C^n(d_v, d_c)$, the ensemble of $(d_v, d_c)$-regular LDPC codes of length n, and suppose that $\Delta_0, \Delta_1, \ldots, \Delta_{N-1}$ are N message-passing algorithms which can be used to decode $C^n(d_v, d_c)$ over a given channel. Each algorithm $\Delta_i$, $0 \leq i \leq N-1$, is specified in iteration l, $l \geq 0$, by $\Psi_{i,v}^{(l)}$ and $\Psi_{i,c}^{(l)}$ its variable-node and check-node message maps, respectively. Assuming that all messages have the same alphabet space M, a new message-passing decoding algorithm $\Delta$ can be formulated and defined based on $\Delta_0, \Delta_1, \ldots, \Delta_{N-1}$ as follows. In iteration l of $\Delta$, variable-nodes and check-nodes are randomly partitioned into N groups according to probability mass function (pmf) vectors $\vec{\alpha}^{(l)} = (\alpha_0^{(l)}, \alpha_1^{(l)}, \ldots, \alpha_{N-1}^{(l)})$ and $\vec{\beta}^{(l)} = (\beta_0^{(l)}, \beta_1^{(l)}, \ldots, \beta_{N-1}^{(l)})$, respectively, and the nodes in group i, $0 \leq i \leq N-1$, process the messages in accordance with the constituent algorithm $\Delta_i$. The new algorithm is said to be the hybrid of $\Delta_0, \Delta_1, \ldots, \Delta_{N-1}$ according to hybridization sequences $\{\vec{\alpha}^{(l)}\}_{l=0}^{\infty}$ and $\{\vec{\beta}^{(l)}\}_{l=0}^{\infty}$, and this is denoted by $\Delta = H(\Delta_0, \Delta_1, \ldots, \Delta_{n-1}, \{\vec{\alpha}^{(l)}\}_{l=0}^{\infty}, \{\vec{\beta}^{(l)}\}_{l=0}^{\infty})$. Note that $\Delta$ can be symbolically specified with message maps $$\Psi_v^{(l)} = \sum_{i=0}^{N-1} \alpha_i^{(l)} \Psi_{i,v}^{(l)},$$

and $$\Psi_c^{(l)} = \sum_{i=0}^{N-1} \beta_i^{(l)} \Psi_{i,c}^{(l)}.$$

The above definition of hybrid algorithms is quite general and covers both $H_{TT}$ and $H_{ST}$ algorithms. In $H_{TT}$ algorithms, $\{\vec{\alpha}^{(l)}\}_{l=0}^{\infty}$ and $\{\vec{\beta}^{(l)}\}_{l=0}^{\infty}$ are independent of l.

In the following, a few illustrative examples are examined to show how hybrid algorithms can improve error performance and convergence speed. In all the examples, as well as the rest of the paper, it is assumed that hybrid algorithms' constituents belong to the family of majority-based (MB) algorithms. More precisely, it is assumed that in all the examples $C^\infty(d_v, d_c)$ is decoded over a binary symmetric channel (BSC), using $\Delta = H(MB^0, MB^1, \ldots, MB^{d_v-1-\lceil d_v/2 \rceil}$, $\{\vec{\alpha}^{(l)}\}_{l=0}^{\infty}, \{\vec{\beta}^{(l)}\}_{l=0}^{\infty}$ is omitted from the equation because a plurality of MB codes are being used, and all check-nodes perform the same operation for MB decoding. As a result, the check-nodes are not partitioned, and only the variable-nodes are partitioned according to the pmf. Such hybrid algorithms are referred to as MB hybrid algorithms. The assumption of majority-based constituents makes the analysis simpler since keeping track of the expected fraction of incorrect messages throughout the iteration process can be performed using closed form formulas.

For a given channel parameter $\epsilon$, an MB algorithm of order $\omega$, $0 \leq \omega \leq d_v - 1 - \lceil d_v/2 \rceil$ can be represented by a density-evolution curve $f_\epsilon^\omega(x)$. Using such a curve, the evolution of the expected fraction of erroneous messages passed in each iteration from a variable-node to a check-node can be tracked. Similarly, the curve $$h_\epsilon^{\vec{\alpha}}(x) = \sum_{\omega=0}^{d_v-1-\lceil d_v/2 \rceil} \alpha_\omega f_\epsilon^\omega(x)$$

which is a linear combination of $f_\epsilon^\omega(x)$ curves represents the density-evolution of the $H_{TT}$ algorithm devised by blending MB algorithms according to the vector $\vec{\alpha} = (\alpha_0, \alpha_1, \ldots, \alpha_{d_v-1-\lceil d_v/2 \rceil})$. The sequence of error probabilities for such an $H_{TT}$ algorithm is monotonic, and is strictly decreasing, constant or strictly increasing if and only if $h_\epsilon^{\vec{\alpha}}(\epsilon)$ is less than, equal to, or greater than $\epsilon$, respectively. The sequence also iteratively converges to zero if and only if $h_\epsilon^{\vec{\alpha}}(x) < x$, $\forall x \in (0, \epsilon]$.

Figure 5:
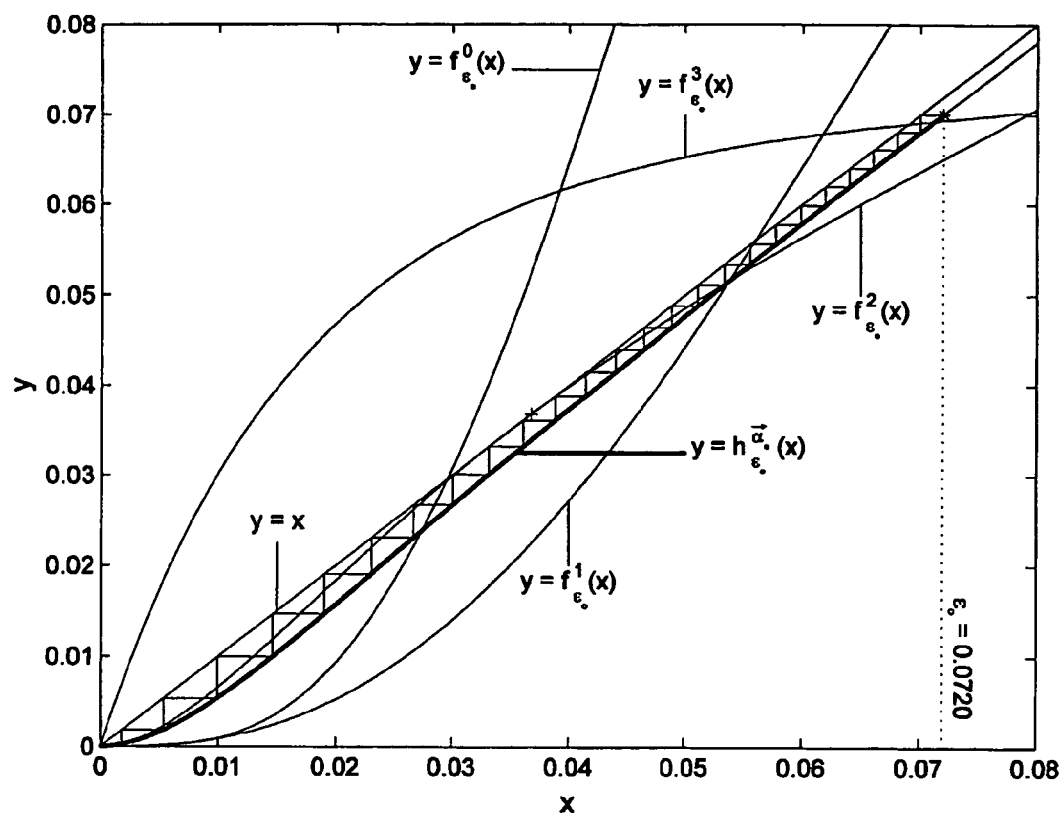
FIG. 5 is a graph showing the density-evolution of an $H_{TI}$ algorithm.

Consider $C^\infty(8, 9)$ and the four MB algorithms that can be used to decode this ensemble over a BSC, namely $MB^0$, $MB^1$, $MB^2$, and $MB^3$. Also, consider $\Delta_0$, the $H_{TT}$ algorithm that blends these MB algorithms according to $\vec{\alpha} = (0, 0.2, 0.8, 0)$. FIG. 5 depicts the curves representing $\Delta_0$ and its constituents for a channel with $\epsilon = 0.0720$.

One can see that the necessary and sufficient condition for the convergence of error probability to zero, i.e., $f_{\epsilon_0}^\omega(x) < x$, $\forall x \in (0, \epsilon_0]$ is not satisfied for either one of constituent MB algorithms. (It can be easily verified that the average probability of error increases with iterations for $MB^0$ and $MB^1$, while for $MB^2$ and $MB^3$, although the average error probability decreases with iterations, it does not approach zero). On the other hand, as the portrayed evolution of the expected fraction of erroneous messages for $\Delta_0$ shows, the average probability of error for this $H_{TT}$ algorithm converges to zero by increasing the number of iterations, and there is still room for $\Delta_0$ to cope with even worse channels. Much the same as $H_{TT}$ algorithms, an $H_{ST}$ algorithm can be represented by a combination of the curves representing its constituents. This combination, however, is piecewise instead of linear.

An $H_{ST}$ algorithm is presented below for comparison purposes to the above described $H_{TI}$ algorithm. $\Delta_0$ is specified by $$\vec{\alpha}_0^{(l)} = \begin{cases} (0, 0, 1, 0), & l \leq 4 \\ (0, 1, 0, 0), & \text{otherwise} \end{cases}.$$

Figure 6:
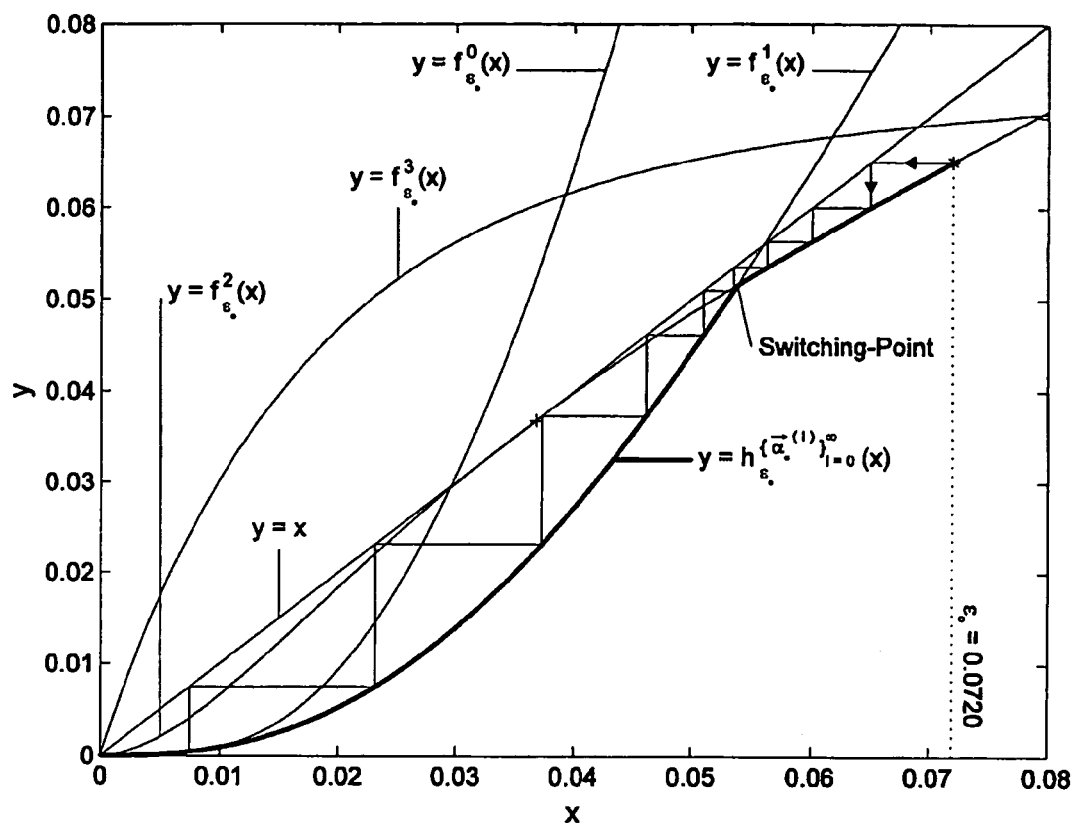
FIG. 6 is a graph showing the density-evolution of an $H_{ST}$ algorithm.

FIG. 6 illustrates the curve representing $\Delta_0$ and its constituents for a channel with $\epsilon=0.0720$. FIG. 6 also illustrates the evolution of the expected fraction of erroneous messages for $\Delta_0$, which converges monotonically to zero with iterations.

In decoding simulations comparing the exemplary $H_{TI}$ and $H_{ST}$ algorithms to each other, it was found that both decoding algorithms provide improved decoding performance over a standard decoder, though the $H_{ST}$ decoder still offers improved performance over the $H_{TI}$ decoder. However, the $H_{TI}$ algorithm does converge, though more slowly than the $H_{ST}$ algorithm, while its consistent codes $MB^1$ and $MB^3$ do not provide a guarantee of convergence to as small a target error rate. The $H_{TI}$ algorithms also provide an easier implementation in hardware than the corresponding $H_{ST}$ algorithm. Additional convergence properties of $H_{TI}$ decoders are described below.

For a message-passing algorithm, the supremum of all channel parameters for which the probability of error converges to zero, is called the threshold. The convergence of an MB hybrid algorithm's error probability to zero for a channel parameter $\epsilon$ implies its convergence to zero for every channel parameter $\epsilon^1 < \epsilon$. Therefore, for all channel parameters less than an MB hybrid algorithm's threshold, the expected fraction of erroneous messages passed in iteration l approaches zero as l tends to infinity, and for all channel parameters greater than the threshold, this fraction is bounded away from zero. For MB hybrid algorithms, the threshold can be maximized over all sequences $\{\vec{\alpha}^{(l)}\}_{l=0}^{\infty}$; the maximum threshold is denoted by $\epsilon^*_{\{MB\ H_{TI}\}}$. For MB $H_{TI}$ algorithms, in particular, we can formulate the maximum threshold as $$\epsilon^*_{\{MBH_{TI}\}} = \max_{\vec{\alpha}} \left\{ \sup \left[ \epsilon \in [0, 0.5] \,\middle|\, h_\epsilon^{\vec{\alpha}}(x) < x, \forall x \in (0, \epsilon] \right] \right\}.$$

Consider $C^\infty(d_v, d_c)$ and all the MB $H_{TI}$ algorithms that can be used to decode this ensemble, either successfully or unsuccessfully, over a binary symmetric channel (BSC) with parameter $\epsilon$. It is clear that the convergence of the error probability to zero with iterations for an MB $H_{TI}$ algorithm depends on the corresponding pmf vector $\vec{\alpha}$, as well as the value of channel parameter $\epsilon$. Any pmf vector $\vec{\alpha}=(\alpha_0,\alpha_1,\ldots \alpha_{d_v-1-\lceil d_v/2\rceil})$ represents a single point in the $d_v-1-\lceil d_v/2\rceil$-dimensional hyperplane defined by $$\sum_{\omega=0}^{d_v-1-\lceil d_v/2\rceil} \alpha_\omega = 1.$$

Depending on $\epsilon$, the average probability of error converges to zero with iterations for some points in this hyperplane. We call the set of all such points convergence domain associated with $\epsilon$, and denote it by $\aleph_\epsilon$, which can be shown to be convex. It is also not difficult to see that $\aleph_\epsilon \subset \aleph_{\epsilon'}$ if $\epsilon' > \epsilon$. Thus by increasing $\epsilon$, the convergence domain shrinks. In the limit, as $\epsilon$ tends to the maximum threshold $\epsilon^*_{\{MB\ H_{TI}\}}$, the domain shrinks to a single-element set containing $\vec{\alpha}^*_{\{MB\ H_{TI}\}}$.

Figure 7:
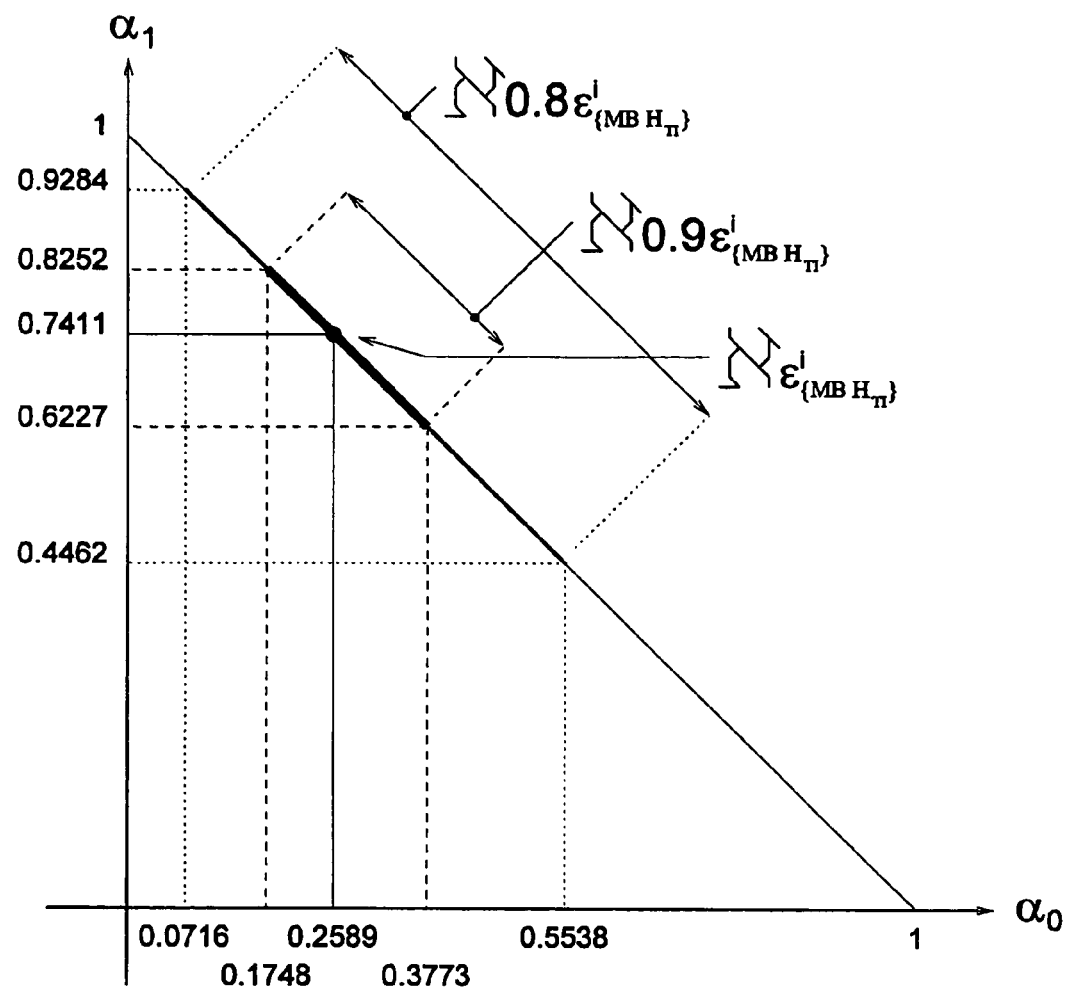
FIG. 7 is a graph showing convergence domains associated with $\epsilon^*_{\{MB\ H_{TI}\}}$, $0.9\epsilon^*_{\{MB\ H_{TI}\}}$, and $0.8\epsilon^*_{\{MB\ H_{TI}\}}$.

Consider $C^\infty(5, 10)$. The maximum threshold $\epsilon^*_{\{MB\ H_{TI}\}}$ for this ensemble is equal to 0.0374, which is achieved using a $\vec{\alpha}_{\{MB\ H_{TI}\}}=(0.2589, 0.7411)$. The thresholds for constituent algorithms $MB^0$ and $MB^1$ are 0.0248 and 0.0277, respectively, both of which are considerably smaller than $\epsilon^*_{\{MB\ H_{TI}\}}$. FIG. 7 illustrates the convergence domains associated with channel parameters $\epsilon^*_{\{MB\ H_{TI}\}}$, $0.9\epsilon^*_{\{MB\ H_{TI}\}}$, and $0.8\epsilon^*_{\{MB\ H_{TI}\}}$. Notice that the hyperplane and the convergence domains here are one-dimensional (line segments). Also, notice that $\aleph_{\epsilon^*_{\{MB\ H_{TI}\}}} \subset \aleph_{0.9\epsilon^*_{\{MB\ H_{TI}\}}} \subset \aleph_{0.8\epsilon^*_{\{MB\ H_{TI}\}}}$.

It is worth mentioning that if the objective is to maximize algorithm's speed of convergence at a target error-rate $\iota$ for a channel parameter $\epsilon$, the problem of finding the optimal vector $\vec{\alpha}^*_{\epsilon,\iota}$, which does not necessarily belong to $\aleph_\epsilon$, can be formulated as the minimization problem. The objective is to minimize for $l \geq 0$, subject to $\alpha_\omega \geq 0, 0 \leq \omega \leq d_v - 1 - \lceil d_v/2 \rceil$ and $$\sum_{\omega=0}^{d_v-1-\lceil d_v/2\rceil} \alpha_\omega = 1$$

and $$\underbrace{h_\epsilon^{\vec{\alpha}} \circ h_\epsilon^{\vec{\alpha}} \circ \ldots \circ h_\epsilon^{\vec{\alpha}}}_{l\ \text{times}}(\epsilon) \leq i,$$

where '$\circ$' denotes the composition of two functions.

Table 1, presented below, lists the threshold values of MB algorithms and the maximum threshold values of MB $H_{TI}$ and $H_{ST}$ algorithms for several $(d_v, d_c)$ pairs. As can be seen, both hybrid algorithms have significantly higher (maximum) thresholds compared to their constituents, which is an indivation of their superior performance.

TABLE 1

| $(d_v, d_c)$ | $\epsilon^*_{MB^0}$ | $\epsilon^*_{MB^1}$ | $\epsilon^*_{MB^2}$ | $\epsilon^*_{MB^3}$ | $\epsilon^*_{\{MB\ H_{TI}\}}$ | $\epsilon^*_{\{MB\ H_{ST}\}}$ |
|---|---|---|---|---|---|---|
| (4, 5) | 0.0260 | 0.0833 | — | — | 0.0947 | 0.0963 |
| (4, 6) | 0.0159 | 0.0666 | — | — | 0.0724 | 0.0747 |
| (4, 7) | 0.0107 | 0.0555 | — | — | 0.0586 | 0.0611 |
| (4, 8) | 0.0077 | 0.0476 | — | — | 0.0491 | 0.0516 |

TABLE 1-continued

| $(d_v, d_c)$ | $\epsilon^*_{MB^0}$ | $\epsilon^*_{MB^1}$ | $\epsilon^*_{MB^2}$ | $\epsilon^*_{MB^3}$ | $\epsilon^*\{MB\ H_{TI}\}$ | $\epsilon^*\{MB\ H_{ST}\}$ |
|---|---|---|---|---|---|---|
| (4, 9) | 0.0058 | 0.0416 | — | — | 0.0423 | 0.0447 |
| (4, 10) | 0.0045 | 0.0370 | — | — | 0.0371 | 0.0378 |
| (5, 6) | 0.0650 | 0.0500 | — | — | 0.0822 | 0.0865 |
| (5, 7) | 0.0482 | 0.0416 | — | — | 0.0640 | 0.0686 |
| (5, 8) | 0.0374 | 0.0357 | — | — | 0.0520 | 0.0566 |
| (5, 9) | 0.0301 | 0.0312 | — | — | 0.0436 | 0.0480 |
| (5, 10) | 0.0248 | 0.0277 | — | — | 0.0374 | 0.0416 |
| (6, 7) | 0.0306 | 0.0806 | 0.0333 | — | 0.0851 | 0.0858 |
| (6, 8) | 0.0236 | 0.0648 | 0.0285 | — | 0.0691 | 0.0704 |
| (6, 9) | 0.0188 | 0.0536 | 0.0250 | — | 0.0576 | 0.0593 |
| (6, 10) | 0.0155 | 0.0453 | 0.0222 | — | 0.0491 | 0.0510 |
| (7, 8) | 0.0494 | 0.0854 | 0.0238 | — | 0.0858 | 0.0858 |
| (7, 9) | 0.0405 | 0.0717 | 0.0208 | — | 0.0724 | 0.0724 |
| (7, 10) | 0.0339 | 0.0615 | 0.0185 | — | 0.0623 | 0.0624 |
| (8, 9) | 0.0296 | 0.0601 | 0.0719 | 0.0178 | 0.0756 | 0.0756 |
| (8, 10) | 0.0247 | 0.0511 | 0.0640 | 0.0158 | 0.0664 | 0.0664 |
| (9, 10) | 0.0409 | 0.0653 | 0.0552 | 0.0138 | 0.0701 | 0.0702 |

Figure 8:
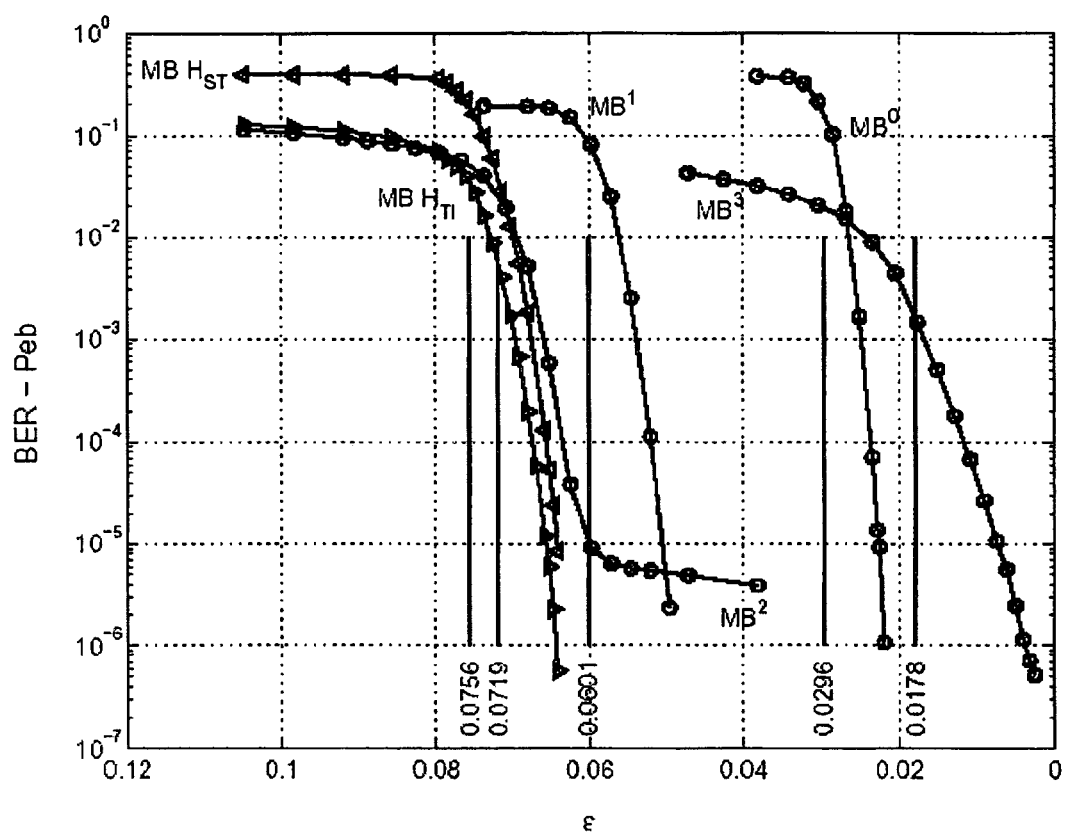
FIG. 8 is a graph comparing the bit error rate performance of finite length $H_{ST}$ and $H_{TI}$ decoders

Comparison of $\epsilon^*_{\{MB\ H_{TI}\}}$ and $\epsilon^*_{\{MB\ H_{ST}\}}$ values in Table 1 shows that MB $H_{TI}$ algorithms are slightly inferior, in terms of performance, to their switch-type counterparts. However, at finite lengths the trend can change with MB $H_{TI}$ algorithms slightly outperforming MB $H_{ST}$ algorithms. Moreover, MB $H_{TI}$ algorithms are more robust and can better cope with unknown or changing channel conditions. FIG. 8 compares the finite length $H_{TI}$ and $H_{ST}$ decoders to their constituent MB decoders. In this example the code is a randomly constructed (8,9)-regular LDPC code of length $9\times10^3$, decoded by $MB^0$, $MB^1$, $MB^2$, $MB^3$, $\Delta^*_{TI}=H_{TI}(MB^0, MB^1, MB^2, MB^3, \vec{\alpha}^*_{\{MB\ H_{TI}\}}^{(l)}=(0,0.15885,084115,0)$, and $$\Delta^*_{ST} = H_{TI}\left(MB^0, MB^1, MB^2, MB^3, \left\{\vec{\alpha}^{*(l)}_{\{MB\ H_{ST}\}}\right\}_{l=0}^{\infty}\right)$$

for $$\vec{\alpha}^{*(l)}_{\{MB\ H_{ST}\}} = \begin{cases} (0, 0, 1, 0) & \text{if } l \leq 19 \\ (0, 1, 0, 0) & \text{if } 20 \leq l \leq 29 \\ (1, 0, 0, 0) & \text{otherwise} \end{cases}$$

all the simulated results, the maximum number of iterations was set to 500. The threshold values for the MB algorithms are $\epsilon^*_{MB^0}=0.0296$, $\epsilon^*_{MB^1}=0.0601$, $\epsilon^*_{MB^2}=0.0719$, and $\epsilon^*_{MB^3}=0.0178$. Both hybrid algorithms have threshold value of 0.0756. From FIG. 8 it can bee seen that the $H_{TI}$ decoder slightly outperforms the $H_{ST}$ decoder in spite of both algorithms having the same maximum threshold.

Figure 9:
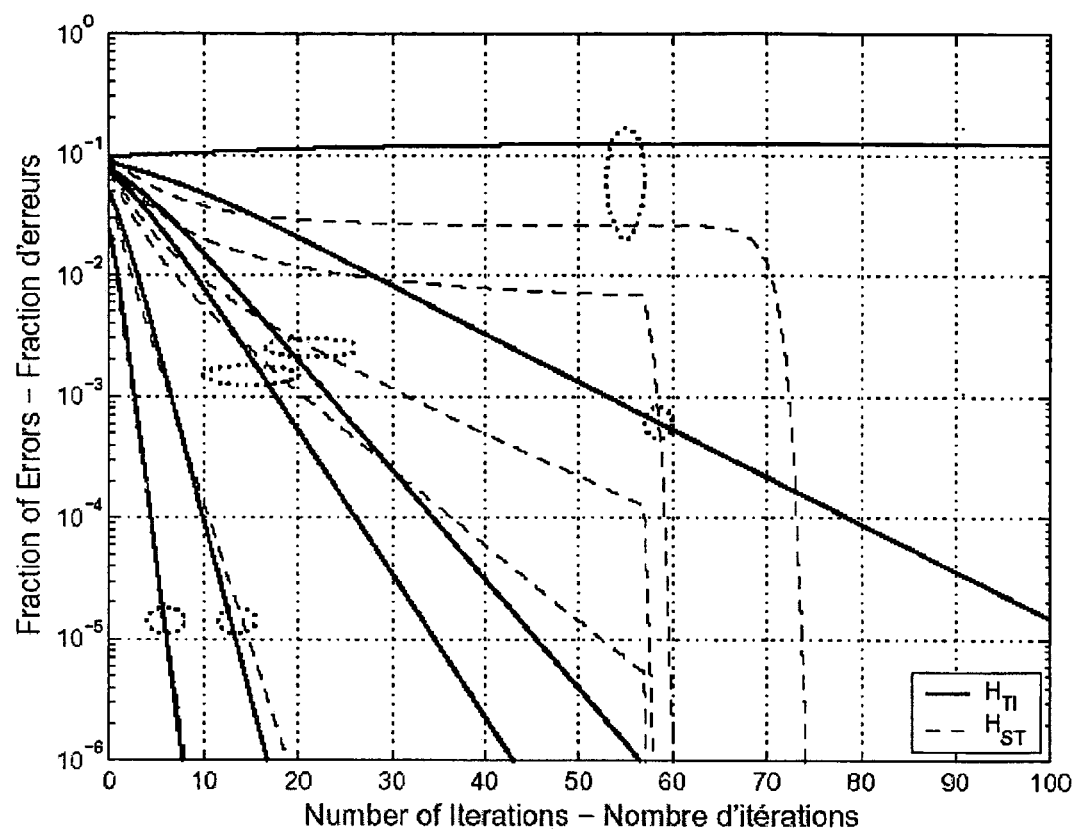
FIG. 9 is a graph showing error-rate curves versus iteration number, for the two algorithms and for several channel parameters.
Figure 10:
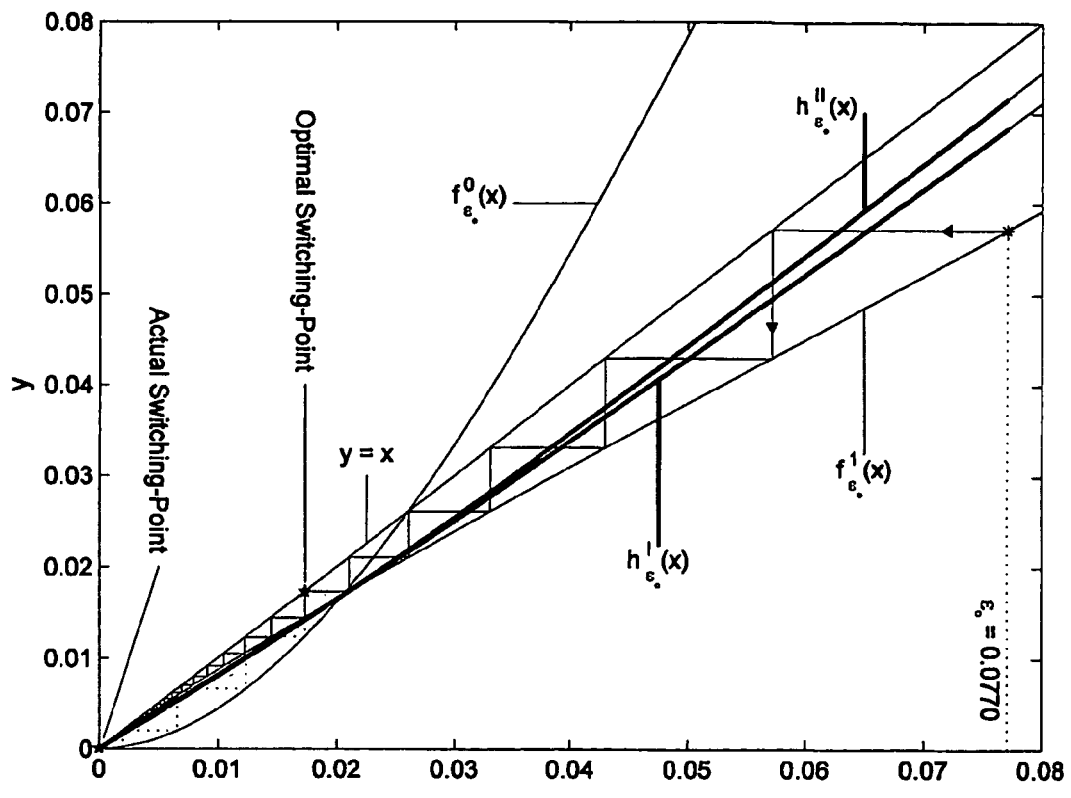
FIG. 10 is a graph showing the density-evolution of $H_{TI}$ and $H_{ST}$ decoders.

Consider $C^\infty(4, 5)$ and the two MB algorithms that can be used to decode this ensemble over a BSC, namely $MB^0$ and $MB^1$. For this ensemble, the maximum thresholds for MB $H_{TI}$ and $H_{ST}$ algorithms are $\epsilon^*_{\{MB\ H_{TI}\}}=0.0947$ and $\epsilon^*_{\{MB\ H_{ST}\}}=0.0963$, respectively. Assuming that the channel parameter is unknown, and our main concern is to ensure the convergence of MB $H_{TI}$ or $H_{ST}$ algorithms for as wide a range of channel parameters as possible, we set both algorithms to achieve their maximum thresholds. FIG. 9 illustrates error-rate curves versus iteration number, for the two algorithms and for several channel parameters. One can see that although the convergence of MB $H_{ST}$ algorithms is faster than that of MB $H_{TI}$ algorithms when the channel parameter is close to the maximum threshold, the performance of $H_{TI}$ decoders can outpace that of $H_{ST}$ decoders for a wide range of target error probabilities, and for a wide range of channel parameters less than the maximum threshold. FIG. 10 illustrates the curves representing $MB^0$ and $MB^1$ for $\Delta^*_{TI}$, and the corresponding $H_{TI}$ decoder in a channel with $\epsilon_0=0.8\epsilon^*_{\{MB\ H_{ST}\}}$. Also shown is the evolution for $\Delta^*_{ST}=H_{ST}(MB^0, MB^1, \{\epsilon^*_{\{MB\ H_{ST}\}}\}_{l=0}^\infty)$ on the same channel. It can be seen that because of the non-optimality of the channel parameter setting, the MB $H_{ST}$ algorithm fails to switch to the right constituent algorithm at the right time, which adversely affects its performance. In this situation, $H_{TI}$ provides better performance over a wide range of target error probabilities.

Figure 11:
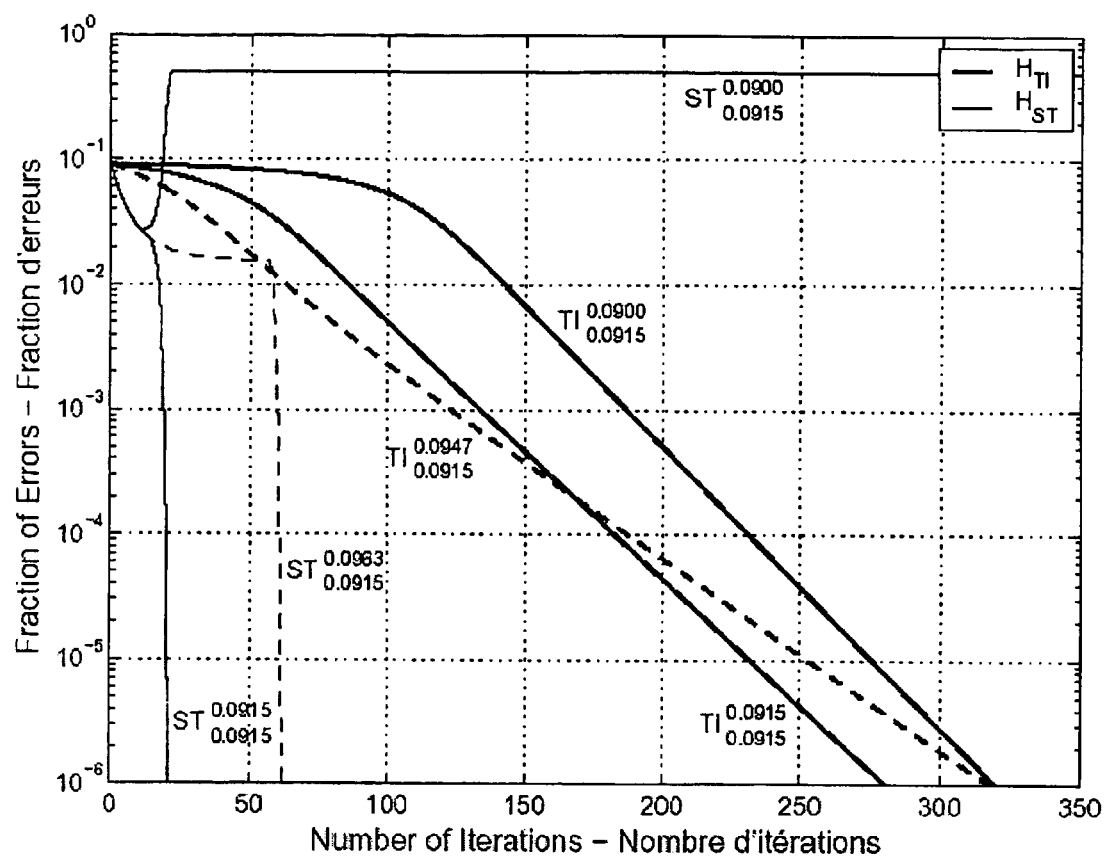
FIG. 11 is a graph comparing the convergence times for $H_{TI}$ and $H_{ST}$ algorithms with misestimated $\epsilon$ values.

Consider again $C^\infty(4, 5)$, $MB^0$, and $MB^1$, and suppose that while the actual channel parameter is $\epsilon_{act}=0.0915$, due to changes in channel condition, or estimation errors, we underestimate the channel parameter, and set MB $H_{TI}$ and $H_{ST}$ algorithms for their fastest convergence at target error-rate of $10^{-6}$ over a channel with estimated parameter $\epsilon_{est}=0.0900$. (For MB $H_{TI}$ algorithms, we have $\vec{\alpha}_{0.0900,10^{-6}}=(0.1353, 0.8647)$ and $\vec{\alpha}_{0.0915,10^{-6}}=(0.1310, 0.8690)$. For MB $H_{ST}$ algorithms, Gallager's algorithm B provides the optimal switching-sequence. Here, the fastest convergence is achieved by starting with $MB^1$, and switching to $MB^0$ after iteration 11 for $\epsilon=0.0900$, and iteration 13 for $\epsilon=0.0915$. The two algorithms are graphically compared in FIG. 11. (The subscripts and the superscripts of the curve labels represent $\epsilon_{act}$ and $\epsilon_{est}$, respectively.)

One can see that while underestimation of the channel parameter results in the failure of the MB $H_{ST}$ algorithm to converge it has a small effect on the performance of the MB $H_{TI}$ algorithm. A comparison of $TI_{0.0915}^{0.0900}$ and $TI_{0.0915}^{0.0915}$ shows that the number of iterations required to achieve an error-rate of $10^{-6}$ increases by less than 15% (281 to 320) due to the underestimation of the channel parameter.

Also comparing $TI_{0.0915}^{0.0947}$ with $TI_{0.0915}^{0.0915}$ shows that the performance of the algorithm designed to achieve the maximum threshold $\epsilon^*_{\{MB\ H_{TI}\}}$, on a channel with parameter $\epsilon=0.0915$ is only slightly inferior to that of the MB $H_{TI}$ algorithm particularly optimized for this channel (and for target error probability of $10^{-6}$), requiring less than 15% increase in the number of iterations. This is in contrast to the case for MB $H_{ST}$ algorithm. The comparison between $ST_{0.0915}^{0.0963}$, ($\epsilon^*_{\{MB\ H_{ST}\}}=0.0963$) and $ST_{0.0915}^{0.0915}$ indicates an increase of nearly 180% in the number of iterations required to achieve an error-rate of $10^{-6}$ (22 to 62).

The above examples show that, unlike MB $H_{ST}$ algorithms, the optimal design for MB $H_{TI}$ algorithms of the present invention is universal in the sense that the MB $H_{TI}$ algorithm designed for $\epsilon^*_{\{MB\ H_{TI}\}}$, performs close to optimal, in terms of convergence speed, on a wide range of channels with $\epsilon < \epsilon^*_{\{MB\ H_{TI}\}}$.

One skilled in the art will appreciate that the present invention can be combined with the $H_{ST}$ architecture, so that in each iteration a plurality of decoding algorithms are being used, but that at predefined iterations the decoding algorithms are changed. Thus, a decoder, and corresponding method, can be provided that only uses partitioned check- or variable-nodes of the same degree in a single iteration, and logically resembles a standard decoder in all other iterations. The present invention is described as time-invariant due to the fact that in some embodiments, a time-invariant decoder can be constructed. The time invariant nature can be related to either the node-by-node algorithms used, or the pmf distribution of the decoding algorithms.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. An iterative decoder for receiving a sequence of sample representing a series of symbols, and for decoding the received sequence to the series, the decoder comprising:
   a plurality of variable-nodes, each node for receiving and storing a sample from the sequence, for iteratively passing messages to, and receiving messages from, at least two connected check-nodes in a plurality of check-nodes, for sending each connected check-node a message determined in accordance with the stored sample and message received from the at least one other check-node segment, and for providing as output a decoded symbol determined in accordance with the received messages from the connected check-nodes and the stored sample,
   at least one node selected from the plurality of variable-nodes and the plurality of check-nodes forming a partition in the respective plurality, the at least one node being of the same degree as at least one node in the at least one other partition, the nodes in each partition using an operation unique to the partition to determine the message to pass to connected nodes.

2. The iterative decoder of claim 1 wherein the number of nodes in each partition is determined using a probability mass function.

3. The iterative decoder of claim 1, wherein the operations performed by each node correspond to a hard decision based decoding operation.

4. The iterative decoder of claim 3, wherein the hard decision based decoding operation is a majority based decoding operation.

5. The iterative decoder of claim 1, wherein the operations performed by each node correspond to a soft decision based decoding operation.

6. The iterative decoder of claim 5, wherein the soft decision based decoding operation is selected from a list including max-log, max-log-APP, belief propagation, and min-sum decoding operations.

7. The iterative decoder of claim 1, wherein each variable-node is connected to at least 2 check-nodes.

8. An iterative decoder for decoding a sequence of samples to a series of symbols, the decoder comprising a plurality of nodes, the plurality having a check-node segment and a variable-node segment, each segment having at least two nodes, each node in the plurality having a degree, and connected to at least two nodes in the other segment for receiving a message from the connected nodes,
   each of the nodes in the variable-node segment for receiving and storing a sample from the sequence of samples, for sending each connected node in the check-node segment a message determined in accordance with the stored sample and messages received from the at least one other node in the check-node segment, and for providing as output a decoded symbol determined in accordance with the received messages from connected nodes in the check-node segment and the stored sample,
   each of the nodes in the check-node segment connected to at least two nodes in the variable-node segment, and for receiving and transmitting messages to each connected node in the variable-node segment, the transmitted messages determined in accordance with the result of an operation performed on messages received from the at least one other connected node,
   at least one of the nodes in the plurality for determining messages in accordance with a different operation than at least one other node having the same degree in the same segment.

9. A method of decoding a sequence of samples to a series of symbols in an iterative decoder having a plurality of variable-nodes and plurality of check-nodes, each of the nodes in each plurality connected to at least two nodes in the other plurality, the number of connections to any node in the plurality defining the degree of the node, the method comprising:
   at each of the variable-nodes in the plurality, receiving and storing one of the samples in the sequence;
   passing a message from each variable-node in the plurality of variable-nodes, to the connected nodes in the plurality of check-nodes, the message determined in accordance with an operation performed on the stored sample;
   passing a message from each check-node to the connected nodes in the plurality of variable-nodes, the message for each connected node determined in accordance an operation performed on the at least one other message received at the check-node;
   at each of the variable-nodes in the plurality, receiving at least two messages from connected nodes, and passing a message to each connected node, the message for each connected node determined in accordance with the message received from the at least one other connected node and the stored sample;
   repeating both the steps of passing a message and the step of receiving and passing, for a predetermined number of iterations, in at least one of the iterations, at least one of the nodes selected from either of the pluralities for passing a message determined in accordance with an operation distinct from the operation performed by at least one other node of the same degree in its plurality; and
   providing as an output, from each variable-node in the plurality of variable-nodes a decoded symbol determined in accordance with the messages received from the connected nodes in the final iteration and the stored sample.

10. The method of claim 9, wherein each sample is one bit in length.

11. The method of claim 9, wherein the operation performed by each variable-node is selected from a list including soft decision and hard decision decoding operations.

12. The method of claim 11, wherein the operation performed by each variable-node is a majority based operation.

13. The method of claim 9, wherein the operation performed by each check-node is selected from a list including soft decision and-hard decision decoding operations.

14. The method of claim 13, wherein the operation performed by each check-node is a majority based operation.

15. The method of claim 9, wherein the number of iterations is predetermined to provide an acceptable error rate.

16. The method of claim 9, wherein in all iterations, at least one node passes a message determined in accordance with an operation distinct from the operation performed by at least one other node of the same degree in its plurality.

17. The method of claim 9, wherein the number of nodes passing a message determined in accordance with an operation distinct from the operation performed by at least one other node of the same degree in its plurality, is determined by a probability mass function.

18. The method of claim 17, wherein the operation used by each node to determine messages is time invariant.

19. The method of claim 17, wherein the particular nodes passing a message determined in accordance with an operation distinct from the operation performed by at lest one other node of the same degree in its plurality are determined randomly.

20. The method of claim 9, wherein at least one check-node and at least one variable-node pass messages determined using operations distinct from the operations performed by at least one other node of the same degree in their respective pluralities.

* * * * *